United States Patent [19]
Inokuchi et al.

[11] Patent Number: 6,139,641
[45] Date of Patent: Oct. 31, 2000

[54] SUBSTRATE PROCESSING APPARATUS HAVING A GAS HEATING TUBE

[75] Inventors: Yasuhiro Inokuchi; Fumihide Ikeda, both of Tokyo, Japan

[73] Assignee: Kokusai Electric Co., Ltd., Tokyo, Japan

[21] Appl. No.: 08/881,147

[22] Filed: Jun. 24, 1997

[30] Foreign Application Priority Data

Jun. 24, 1996 [JP] Japan .................................. 8-184115

[51] Int. Cl.[7] .......................... C23C 16/00; C23C 16/455
[52] U.S. Cl. ........................... 118/724; 118/715; 219/390
[58] Field of Search .................................. 118/724, 725, 118/715

[56] References Cited

U.S. PATENT DOCUMENTS

| | | | |
|---|---|---|---|
| 5,279,670 | 1/1994 | Watanabe et al. | 118/725 |
| 5,336,327 | 8/1994 | Lee | 118/715 |
| 5,551,982 | 9/1996 | Anderson et al. | 118/715 |

FOREIGN PATENT DOCUMENTS

| | | |
|---|---|---|
| 61-136534 | 8/1986 | Japan . |
| 7176498 | 7/1995 | Japan . |
| 9117545 | 5/1991 | Rep. of Korea . |

OTHER PUBLICATIONS

Wolf, S. and R.N. Tauber, Silicon Processing for the VLSI Era vol. 1—Process Technology pp. 167–168, 1986.

Translation of Official Notice of Preliminary Rejection; Korean Patent Appln. No. 10–1997–0026874; "Substrate Processing Apparatus"; Jun. 14, 2000.

*Primary Examiner*—Shrive Beck
*Assistant Examiner*—Sylvia R. MacArthur

[57] ABSTRACT

A substrate processing apparatus comprises a heating member, a reaction tube body provided in the heating member and having a first gas introducing section and a gas exhausting section, a substrate holder disposed in the reaction tube body for horizontally holding a substrate within the reaction tube body between the first gas introducing section and the gas exhausting section, a gas heating tube provided in the heating member along the reaction tube body, and having a second gas introducing section and a gas discharging section which is in communication with the first gas introducing section of the reaction tube body, the gas heating tube being arranged such that a gas flowing in the gas heating tube first flows form the first gas introducing section side toward the gas exhausting section side, and then returns to flow from the gas exhausting section side toward the first gas introducing section side.

27 Claims, 7 Drawing Sheets

"CONVENTIONAL ART"

SUBSTRATE PROCESSING APPARATUS HAVING A GAS HEATING TUBE

BACKGROUND OF THE INVENTION

1. Field of the Invention

The present invention relates to a substrate processing apparatus, and more particularly, to a substrate processing apparatus for subjecting a semiconductor wafer to a process such as a film formation in a single substrate-processing manner or a small number of substrates-processing manner at a time.

2. Description of the Related Art

Conventionally, a reaction tube used with a substrate processing apparatus of a type described above has the structure shown in FIG. 15 which is a plan view of a conventional substrate processing apparatus.

The substrate processing apparatus 200 is provided with a heater 70 and a reaction tube 80 disposed therein. The reaction tube 80 is provided with a reaction tube body 81, a reaction gas introducing tube 85 and a reaction tube flange 83. A reaction gas introducing hole 82 is provided at a central portion of an upstream of the reaction tube body 81. The reaction gas introducing tube 85 is provided in communication with an interior of the reaction tube body 81 through the reaction gas introducing hole 82. The reaction tube body 81 is provided at its downstream with the reaction tube flange 83. The reaction tube flange 83 is provided with a wafer transfer hole 84. In a state where a semiconductor wafer 90 is held in the reaction tube body 81, heating is effected by the heater 70 and a reaction gas is introduced from the reaction gas introducing hole 82 into the reaction tube body 81, and is exhausted from the wafer transfer hole 84 of the reaction tube flange 83, thereby processing of the semiconductor wafer 90 such as achieve film formation.

According to the conventional reaction tube 80, however, the reaction gas is introduced into the reaction tube 80 without being sufficiently heated and therefore, a temperature of the reaction gas upstream of the semiconductor wafer 90 is lowered, and there is a problem that a thickness of a film formed on the semiconductor wafer 90 becomes non-uniform.

SUMMARY OF THE INVENTION

Therefore, a main object of the present invention is to provide a substrate processing apparatus capable of conducting a uniform substrate processing such as obtaining an excellent thickness distribution of a formed film.

According to a first aspect of the present invention, there is provided a substrate processing apparatus, including:

a heater;

a reaction tube body provided in the heater means, and having a first gas introducing section and a gas exhausting section separated at a predetermined distance from each other in a predetermined first direction;

a substrate holder disposed in the reaction tube body and being capable of holding a substrate within the reaction tube body between the first gas introducing section and the gas exhausting section in a state where a main face of the substrate is substantially parallel to a first plane which includes the first direction and a second direction perpendicular to the first direction; and a gas heating tube provided in the heater means along the reaction tube body, and having a second gas introducing section and a gas discharging section which is in communication with the first gas introducing section of the reaction tube body, the gas heating tube having a structure wherein a gas flowing in the gas heating tube first flows from the side of the first gas introducing section toward the side of the gas exhausting section and then, returns to flow from the gas exhausting section side toward the first gas introducing section side.

According to a second aspect of the present invention, there is provided a hot-wall type substrate processing apparatus, including:

a heater;

a reaction tube body provided in the heater, the reaction tube body including: a first gas introducing section and a gas exhausting section separated at a predetermined distance from each other in a predetermined first direction; a first side plate substantially perpendicular to the first direction and having the first gas introducing section; a ceiling plate and a bottom plate substantially parallel to a first plane including the first direction and a second direction substantially perpendicular to the first direction; and second and third side plates which is substantially parallel to the first direction and is substantially perpendicular to the first plane;

a substrate holder disposed in the reaction tube body and being capable of holding a substrate within the reaction tube body between the first gas introducing section and the gas exhausting section in a state where a main face of the substrate is substantially parallel to the first plane; and a gas heating tube provided in the heater along one of or both of the second side plate and the third side plate, and having a second gas introducing section and a gas discharging section which is in communication with the gas introducing section of the reaction tube body.

BRIEF DESCRIPTION OF THE DRAWINGS

The above and further objects, features and advantages of the present invention will become more apparent from the following detailed description taken in conjunction with the accompanying drawings, wherein.

Figure 1:
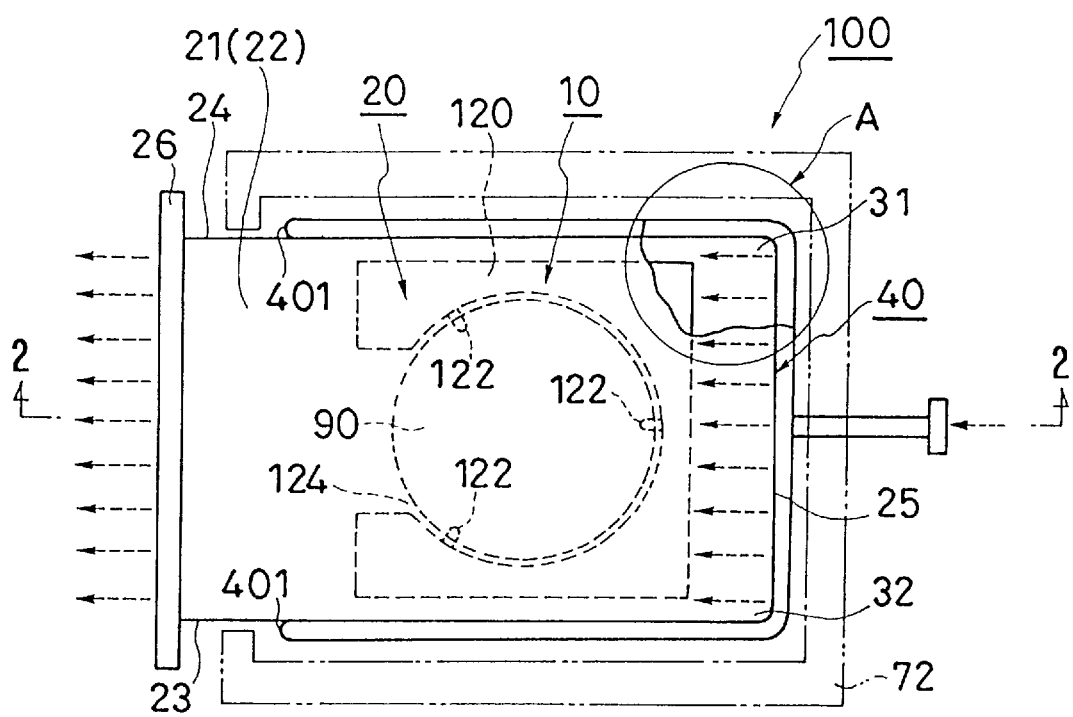
FIG. 1 is a plan view, partially broken away, for explaining a substrate processing apparatus according to first and second embodiments of the present invention.
Figure 2:
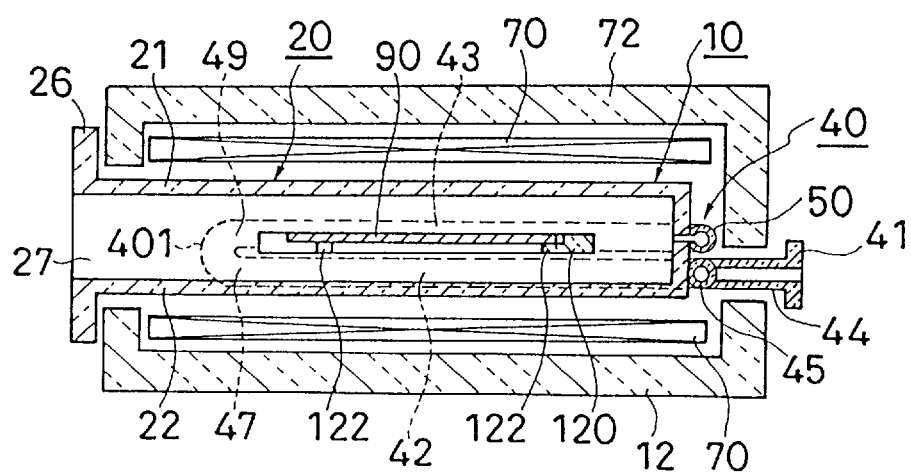
FIG. 2 is a sectional view taken along the line X2—X2 in FIG. 1.
Figure 3:
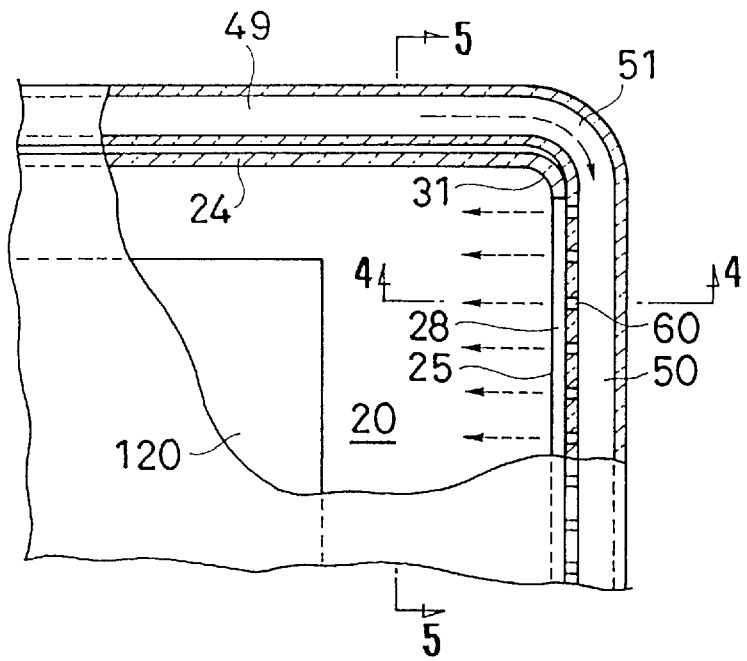
FIG. 3 is an enlarged view of a portion in FIG. 1 surrounded by the circle A.
Figure 4:
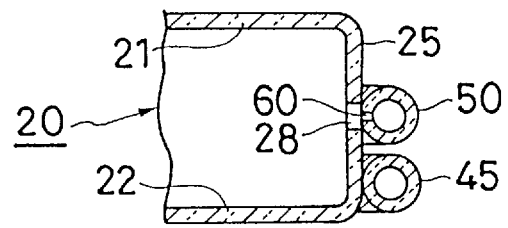
FIG. 4 is a sectional view taken along the line X4—X4 in FIG. 3.
Figure 5:
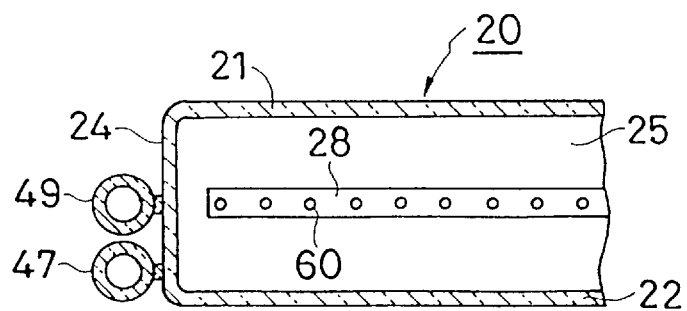
FIG. 5 is a sectional view taken along the line X5—X5 in FIG. 3.
Figure 6:
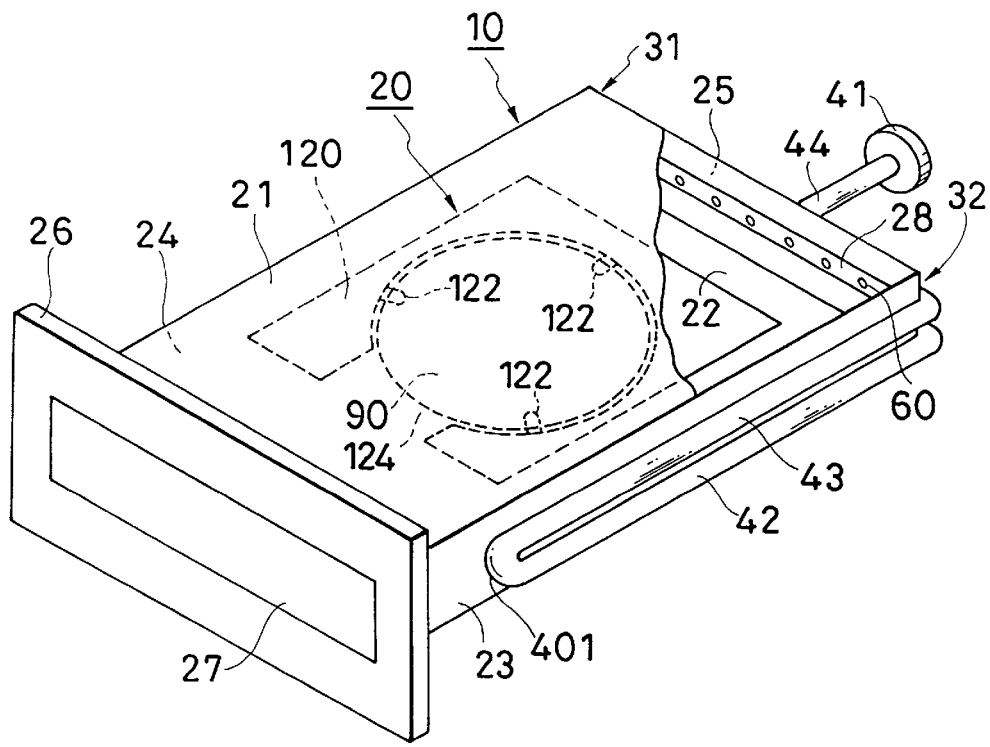
FIG. 6 is a perspective view for explaining a reaction tube used in the substrate processing apparatus of the first embodiment.
Figure 7:
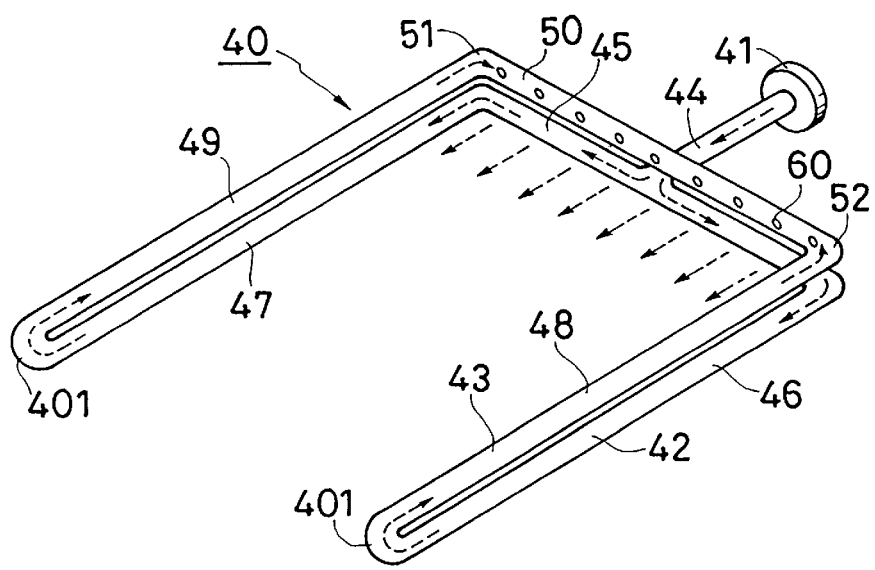
FIG. 7 is a perspective view for explaining the reaction tube used in the substrate processing apparatus of the first embodiment.
Figure 8:
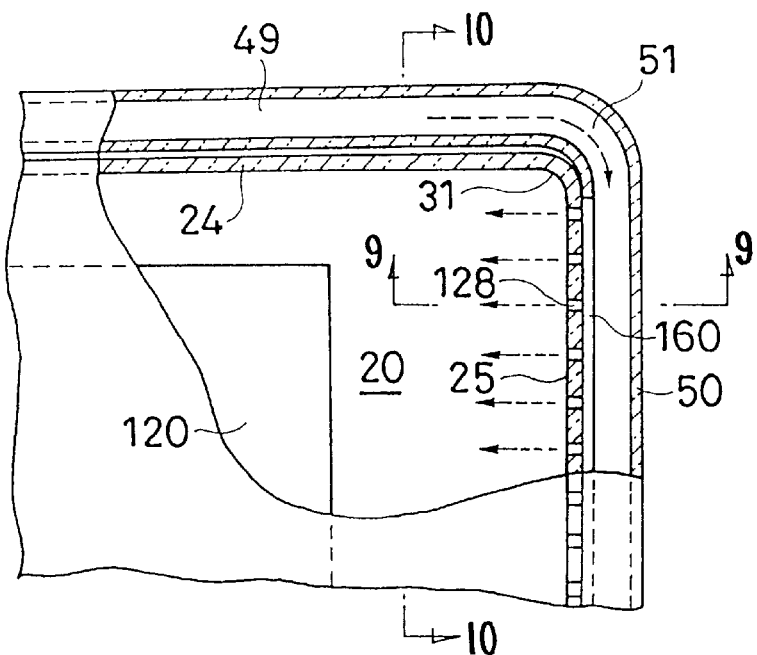
FIG. 8 is an enlarged view of the portion in FIG. 1 surrounded by the circle A for explaining a reaction tube used in a substrate processing apparatus according to the second embodiment.
Figure 9:
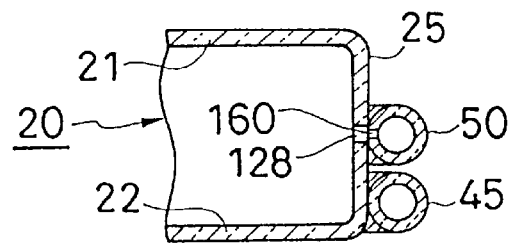
FIG. 9 is a sectional view taken along the line X9—X9 in FIG. 8.
Figure 10:
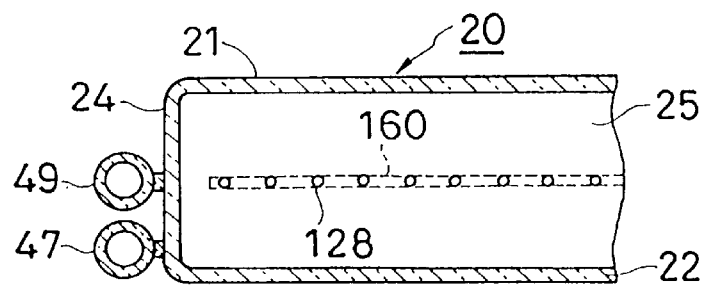
FIG. 10 is a sectional view taken along the line X10—X10 in FIG. 8.
Figure 11:
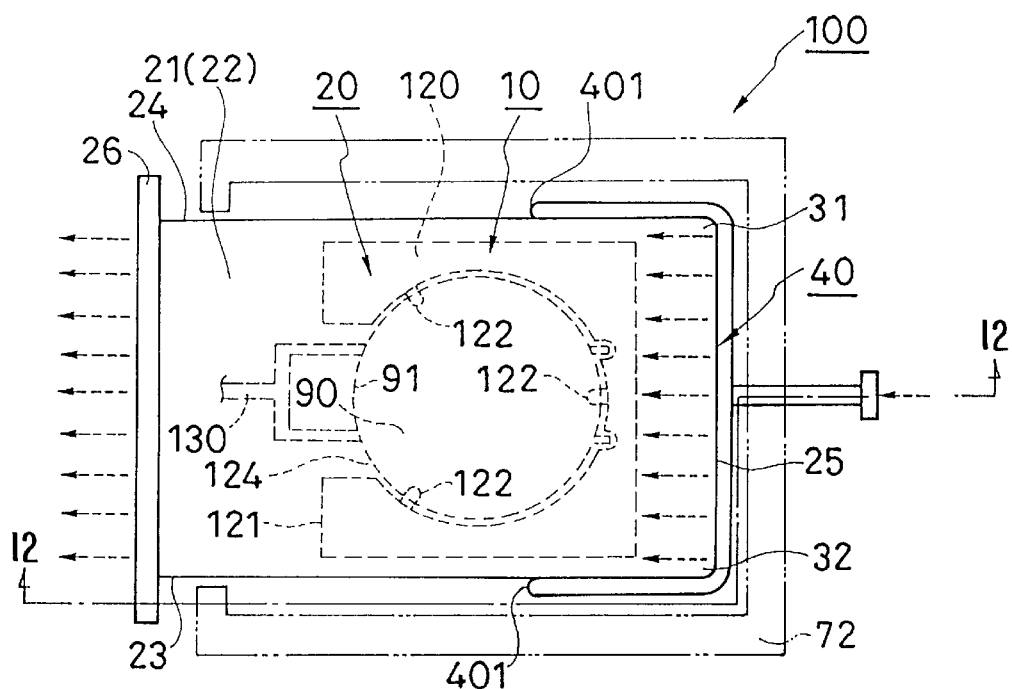
FIG. 11 is a plan view for explaining a substrate processing apparatus according to a third embodiment, in which a semiconductor wafer is mounted on a wafer mounting plate.
Figure 12:
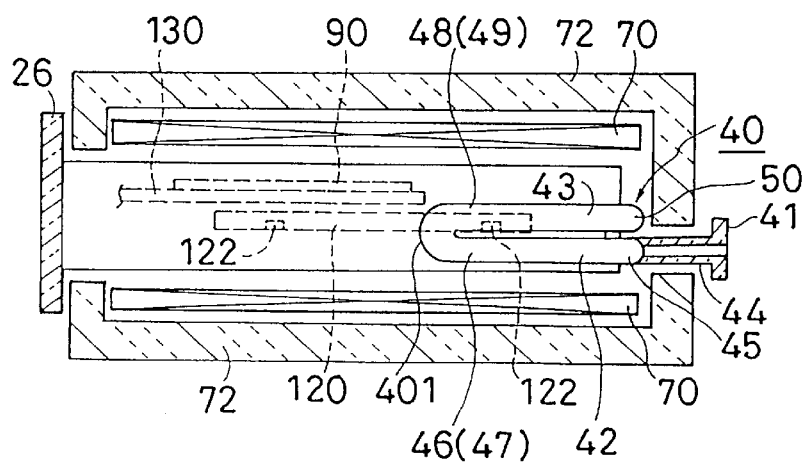
FIG. 12 is a sectional view taken along the line X12—X12 in FIG. 11, showing a state before mounting the semiconductor wafer on the wafer mounting plate.
Figure 13:
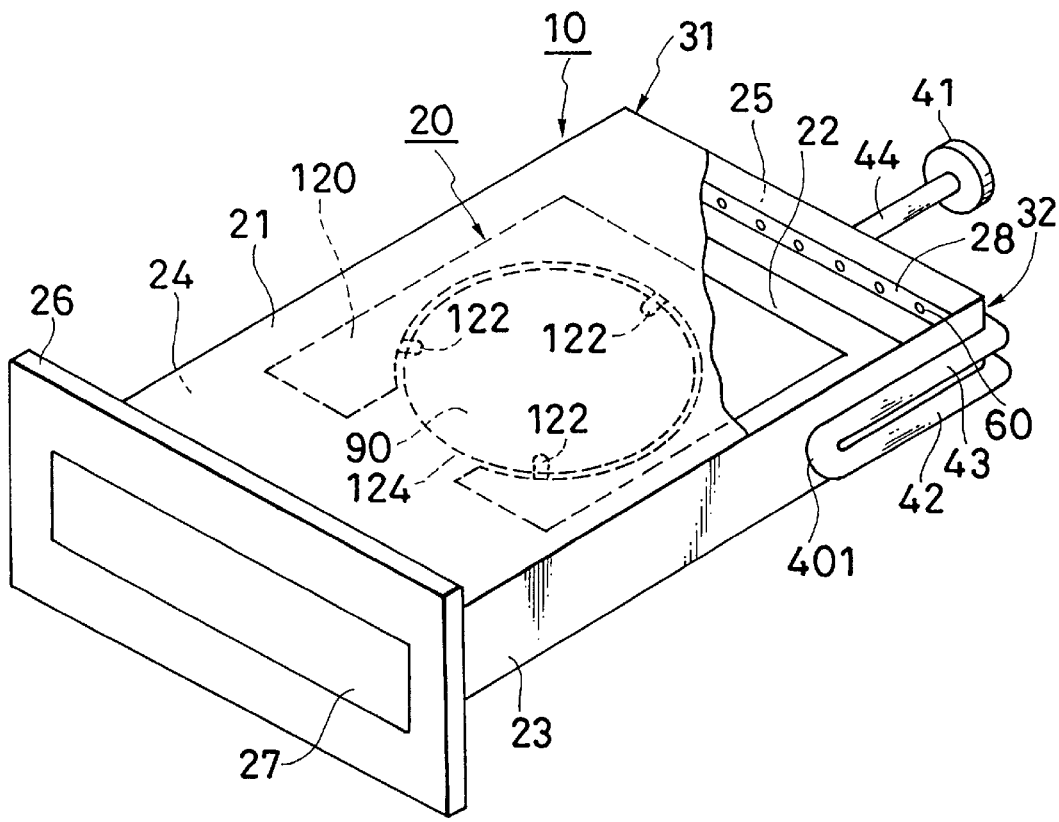
FIG. 13 is a perspective view for explaining a reaction tube used in the substrate processing apparatus of the third embodiment.
Figure 14:
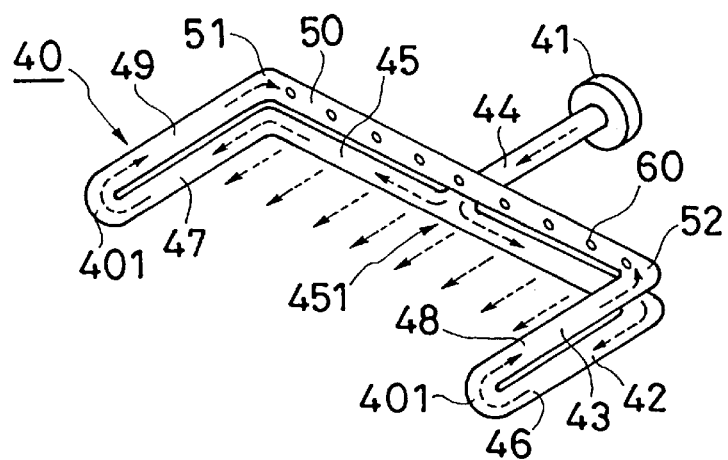
FIG. 14 is a perspective view for explaining the reaction tube used in the substrate processing apparatus of the third embodiment.

DESCRIPTION OF THE PREFERRED EMBODIMENTS (First Embodiment)

Referring to FIGS. 1 to 7, there is shown a substrate processing apparatus 100 of a single substrate-processing type according to a first embodiment of the present invention. The substrate processing apparatus 100 is provided with a heater 70, a reaction tube 10 provided in the heater 70, and a thermal insulator 72. Each of the heater 70 and the reaction tube 10 are covered at their upper, lower, left and right portions with the thermal insulator 72, and are formed into a so-called hot-wall type structure. The reaction tube 10 is provided with a reaction tube body 20, a gas heating tube 40 and a reaction tube flange 26. A wafer mounting plate 120 is provided in the reaction tube body 20. The wafer mounting plate 120 is formed with a space 124 having a diameter larger than that of a Si-semiconductor wafer 90. Three wafer supporting claws 122 are projectingly provided in the space 124. The reaction tube body 20 and the gas heating tube 40 are made of quartz.

The reaction tube body 20 is substantially formed into a rectangular parallelepiped shape, and includes a ceiling plate 21, a bottom plate 22 and side plates 23, 24 and 25. The ceiling plate 21 and the bottom plate 22 are parallel to each other, and the side plates 23 and 24 are parallel to each other. The side plate 25 is perpendicular to the ceiling plate 21, the bottom plate 22 and side plates 23 and 24. The wafer mounting plate 120 is disposed, in the reaction tube body 20, parallel to the ceiling plate 21 and the bottom plate 22. One sheet of the Si-semiconductor wafer 90 is supported by the wafer supporting claws 122 of the wafer mounting plate 120 and is disposed in the space 124. A surface of the Si-semiconductor wafer 90 and an upper face of the wafer mounting plate 120 are within the same plane. The Si-semiconductor wafer 90 is held in parallel to the ceiling plate 21 and the bottom plate 22.

The side plate 25 is provided, at a height substantially equal to the semiconductor wafer 90, with a rectangular opening 28 which is parallel to a surface of the semiconductor wafer 90 and which is long in a lateral direction. The opening 28 extends from the vicinity of a corner portion 31 between the side plates 25 and 24 to the vicinity of a corner portion 32 between the side plates 25 and 23. The reaction tube flange 26 is provided at a downstream of the reaction tube body 20 at the opposite side of the side plate 25. The reaction tube flange 26 is provided with a wafer transfer hole 27 which is rectangular in shape. The wafer transfer hole 27 has a size substantially equal to a phantom opening of the reaction tube body 20 obtained by cutting the reaction tube body 20 in a direction intersecting a direction of a gas flow at a right angle.

The gas heating tube 40 includes a lower gas heating tube 42 and an upper gas heating tube 43. The lower gas heating tube 42 includes substantially straight tubes 45, 46 and 47. The upper gas heating tube 43 includes substantially straight tubes 48, 49 and 50. The tubes 45 and 50 are provided in parallel to a surface of the semiconductor wafer 90 along the outer side of the side plate 25, the tubes 46 and 48 are provided in parallel to the surface of the semiconductor wafer 90 along the outer side of the side plate 23, and the tubes 47 and 49 are provided in parallel to the surface of the semiconductor wafer 90 along the outer side of the side plate 24.

One end of the tube 44 is in communication with a central portion of the tube 45, and the other end of the tube 44 is formed with a gas supply hole 41. One end of the tube 45 is in communication with one end of the tube 46, the other end of the tube 46 is in communication with one end of the tube 48, and the other end of the tube 48 is in communication with one end of the tube 50. The other end of the tube 45 is in communication with one end of the tube 47, the other end of the tube 47 is in communication with one end of the tube 49, and the other end of the tube 49 is in communication with the other end of the tube 50.

The tube 50 is provide with a plurality of gas discharging holes 60 forming a line parallel to a surface of the semiconductor wafer 90 at a height substantially equal to the semiconductor wafer 90. These gas discharging holes 60 are arranged from the vicinity of the corner portion 31 between the side plates 25 and 24 to the vicinity of the corner portion 32 between the side plates 25 and 23. The opening 28 formed in the side plate 25 is designed such as to expose all of the plurality of gas discharging holes 60 provided in the tube 50, and these gas discharging holes 60 are in communication with the opening 28 of the side plate 25.

All of the reaction tube body 20, the gas heating tube 40, the reaction tube flange 26, the wafer mounting plate 120, the semiconductor wafer 90, the tube 44, the opening 28, the plurality of gas discharging holes 60 and the wafer transfer hole 27 are formed symmetrically.

The gas heating tube 40 is welded to the reaction tube body 20.

In a state where a sheet of the semiconductor wafer 90 is held in the reaction tube body 20, a reaction gas is supplied from the gas supply hole 41 while being heated by the heater 70 to conduct a process such as a film formation.

The reaction gas supplied from the gas supply hole 41 is supplied to the central portion of the tube 45 through the tube 44. Thereafter, the reaction gas diverges in left and right directions within the tube 45, and respectively flow into the lower tubes 46 and 47 which are formed symmetrically. The reaction gas, after passing through the tubes 46 and 47, returns to flow into the upper tubes 48 and 49, respectively, and flows therethrough into opposite ends of the tube 50. Thereafter, the reaction gas is introduced into the reaction tube body 20 through the gas discharging holes 60 provided in the tube 50 forming a line laterally as well as through the opening 28 provided in the side plate 25. The gas, after reaction, is exhausted through the wafer transfer hole 27 of the flange 26.

In the present embodiment, the reaction gas is supplied into the reaction tube body 20 after passing through the gas heating tube 40 which is heated by the heater 70. Therefore, the reaction gas is preheated and introduced into the reaction tube body 20. As a result, an upstream portion of the semiconductor wafer 90 is restrained from being cooled by the reaction gas, which enhances the uniformity of distribution of temperature over the entire surface of the semiconductor wafer 90, and also enhances the uniformity of a thickness of a film over the entire surface thereof which is formed on a surface of the semiconductor wafer 90, especially the uniformity of the thickness of the film in a direction of a flow of the reaction gas. Further, depending on a kind or type of the gas, it is possible to sufficiently decompose the reaction gas within the gas heating tube 40, and as a result, a quality of the film is enhanced.

Further, because the gas heating tube 40 is disposed along the side plates 23, 24 and 25 of the reaction tube body 20, the substrate processing apparatus 100 can be made small in size.

All of the reaction tube body 20, the gas heating tube 40, the reaction tube flange 26, the wafer mounting plate 120, the semiconductor wafer 90, the tube 44, the opening 28, and the plurality of gas discharging holes 60 are formed symmetrically and therefore, it is possible to keep the balance in temperature between left and right sides, and to equalize flow speed of the reaction gas introduced into the reaction tube body 20 from left and right sides. As a result, it is possible to enhance the uniformity of a thickness of a film over the entire surface which is formed on a surface of the semiconductor wafer 90, especially the uniformity of the thickness of the film in a lateral direction with respect to a direction of a flow of the gas.

Figure 15:
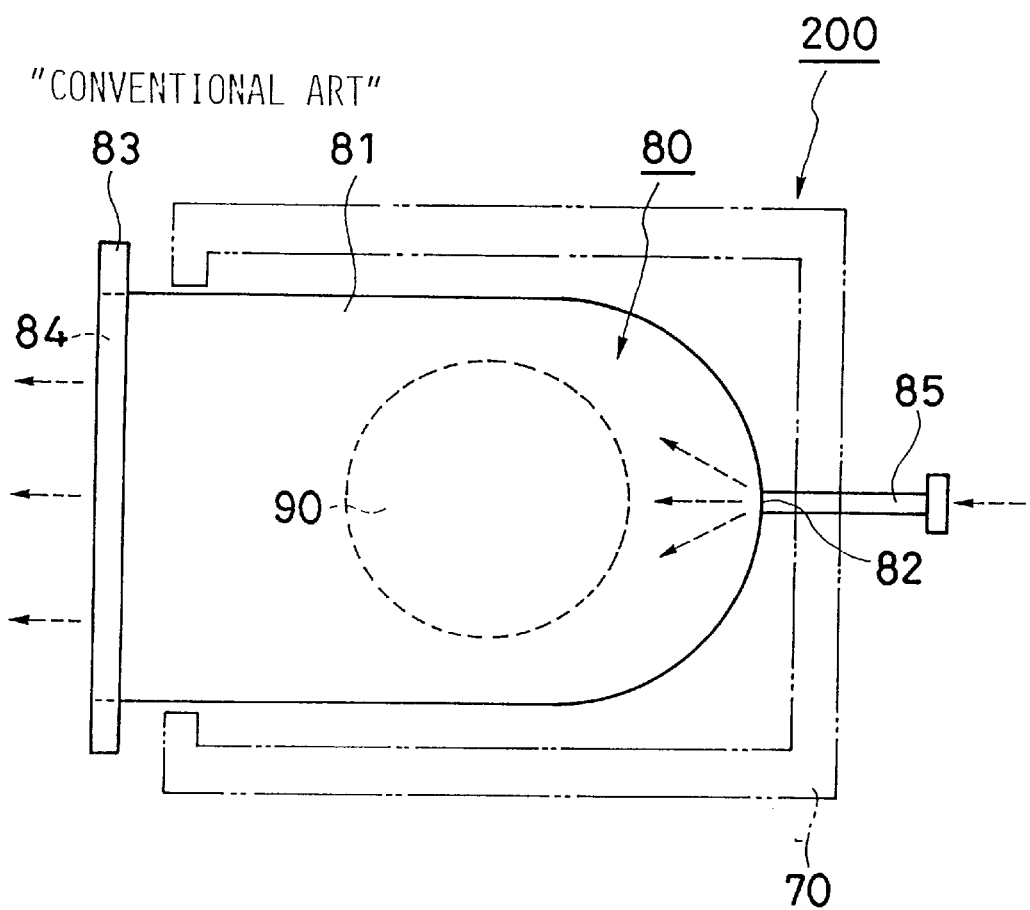
FIG. 15 is a plan view for explaining a reaction tube used in a conventional substrate processing apparatus.

Further, the tube 50 is provided with the plurality of gas discharging holes 60 forming a line in parallel to a surface of the semiconductor wafer 90, and the side plate 25 is provided the opening 28 such as to expose the gas discharging holes 60. Therefore, the reaction gas is introduced like a shower, and the reaction gas flow above the surface of the semiconductor wafer 90 becomes a laminar flow, which further enhances the uniformity of a thickness of the film. In contrast, in the reaction tube 80 of the conventional structure as is shown in FIG. 15, because only one gas introducing hole 82 is provided, the gas flow above the semiconductor wafer 90 does not become a laminar flow and thus, a thickness of the film formed on the semiconductor wafer 90 is prone to be nonuniform.

The plurality of gas discharging holes 60 are provided from the vicinity of the corner portion 31 between the side plates 25 and 24 to the vicinity of the corner portion 32 between the side plates 25 and 23. Therefore, turbulence zones of the reaction gas introduced into the reaction tube body 20 can be decreased and as a result, the gas flow can be formed into a laminar flow, and a replacement efficiency of the gas can be enhanced.

Further, in such a hot-wall type substrate processing apparatus, because the entire reaction tube body 20 is kept at a predetermined temperature, even if the gas heating tube 40 is disposed along the side plates 23, 24 and 25, it is possible to sufficiently preheat the reaction gas. Furthermore, because the gas heating tube 40 is disposed along the side plates 23, 24 and 25, and the gas heating tube 40 does not face the ceiling plate 21 and the bottom plate 22, the heater 70 which faces the ceiling plate 21 and the bottom plate 22 of the reaction tube body 20 is not blocked or interrupted by the gas heating tube 40, and as a result, the uniformity of the distribution of temperature over the entire surface of the semiconductor wafer 90 is enhanced.

Also, by disposing the gas heating tube 40 along the side plates 23, 24 and 25 of the reaction tube body 20 as described above, it is possible to restrain the substrate processing apparatus 100 from increasing its height, and it is easy to uniform the distribution of temperature over the entire surface of the semiconductor wafer 90. In contrast, if the gas heating tube 40 is disposed along the ceiling plate 21 or the bottom plate 22 of the reaction tube body 20, the height of the substrate processing apparatus 100 is increased by such an amount. In order to process a large number of semiconductor wafers 90 in a small floor space, piling up a plurality of reaction tube bodies 20 in a vertical direction seems to be an effective way. In such a case, however, if each of the gas heating tubes 40 is disposed along the ceiling plate 21 or the bottom plate 22 of the reaction tube body 20, the number of the reaction tube bodies 20 which can vertically be piled up is reduced and thus, the number of semiconductor wafers 90 per unit area is reduced.

If the gas heating tube 40 is disposed along the ceiling plate 21 or the bottom plate 22 of the reaction tube body 20, because the ceiling plate 21 and the bottom plate 22 are provided in parallel to a major surface of the semiconductor wafer 90, it is difficult to make uniform the distribution of temperature over the entire surface of the semiconductor wafer 90 unless the gas heating tube 40 is disposed uniformly along the ceiling plate 21 or the bottom plate 22 of the reaction tube body 20. Further, such a structure itself in which the gas heating tube 40 is uniformly disposed along the ceiling plate 21 or the bottom plate 22 of the reaction tube body 20 is difficult, which increases manufacturing costs. In contrast, if the gas heating tube 40 is disposed along the side plates 23, 24 and 25 of the reaction tube body 20, it is possible to easily make uniform the distribution of temperature over the entire surface of the semiconductor wafer 90 with a simple structure.

In the present embodiment, taking into consideration the fact that the amount of gas diverged into the left and right gas heating tube may not always be equal to each other, the left and right portions of the gas heating tube are joined to each other at their end portions, so as to moderate a difference in the amount of gas between the left and right sides of the gas heating tube. Further, in order to avoid disturbing the distribution of temperature in the vicinity of the semiconductor wafer 90, the gas heating tube 40 is disposed at a location away from the both sides of the semiconductor wafer.

(Second Embodiment)

In the first embodiment described above, the tube 50 of the gas heating tube 40 is provided with the plurality of gas discharging holes 60, and the side plate 25 of the reaction tube body 20 is provided with the opening 28 which exposes the plurality of gas discharging holes 60. However, as is shown in FIGS. 1, 2 and 8 to 10, the second embodiment differs from the first embodiment in that the side plate 25 of the reaction body 20 is provided with a plurality of gas introducing holes 128 such as to form a line in parallel to the semiconductor wafer 90 at a height substantially equal to the semiconductor wafer 90, and the tube 50 is provided with an opening 160 which is long in a lateral direction and which is in communication with the plurality of gas introducing holes 128. Other structures are the same as those of the first embodiment.

Also, in the present embodiment, the reaction gas is supplied into the reaction tube body 20 after passing through the gas heating tube 40 which is heated by the heater 70. Therefore, the reaction gas is preheated and introduced into the reaction tube body 20. As a result, an upstream portion of the semiconductor wafer 90 is restrained from being cooled by the reaction gas, which enhances the uniformity of distribution of temperature over the entire surface of the semiconductor wafer 90, and also enhances the uniformity of a thickness of a film over the entire surface thereof which is formed on a surface of the semiconductor wafer 90, especially the uniformity of the thickness of the film in a direction of a flow of the reaction gas. Further, depending on a kind or type of the gas, it is possible to sufficiently decompose the reaction gas within the gas heating tube 40, and as a result, a quality of the film is enhanced.

Further, because the gas heating tube 40 is disposed along the side plates 23, 24 and 25 of the reaction tube body 20, the substrate processing apparatus 100 can be made small in size.

These gas introducing holes 128 are arranged from the vicinity of the corner portion 31 between the side plates 24 and 25 to the vicinity of the corner portion 32 between the side plates 23 and 25. All of the reaction tube body 20, the gas heating tube 40, the reaction tube flange 26, the wafer mounting plate 120, the semiconductor wafer 90, the tube 44, the opening 160, the plurality of gas introducing holes 128 and the wafer transfer hole 27 are formed symmetrically.

Therefore, it is possible to keep the balance in temperature between left and right sides, and to equalize flow speed of the reaction gas introduced into the reaction tube body 20 from left and right sides. As a result, it is possible to enhance the uniformity of a thickness of a film over the entire surface which is formed on a surface of the semiconductor wafer 90, especially the uniformity of the thickness of the film in a lateral direction with respect to a direction of a flow of the gas.

Further, the side plate 25 is provide with the plurality of gas introducing holes 128 forming a line in parallel to a surface of the semiconductor wafer 90, and the tube 50 is provided the opening 160 such as to communicate with the plurality of gas introducing holes 128. Therefore, the reaction gas is introduced like a shower, and the reaction gas flow above the surface of the semiconductor wafer 90 become a laminar flow, which further enhances the uniformity of a thickness of the film.

The plurality of gas introducing holes 128 are provided from the vicinity of the corner portion 31 between the side plates 25 and 24 to the vicinity of the corner portion 32 between the side plates 25 and 23. Therefore, turbulence zones of the reaction gas introduced into the reaction tube body 20 can be decreased and as a result, the gas flow can be formed into a laminar flow, and a replacement efficiency of the gas can be enhanced.

(Third Embodiment)

In the above described first embodiment, a tip end 401 of the has heating tube 40 extends beyond the semiconductor wafer 90 and the wafer mounting plate 120 and reaches the vicinity of the reaction tube flange 26, and the gas heating tube 40 is provided along the side plates 23 and 24 of the reaction tube body 20. However, as is shown in FIGS. 11 to 14, the third embodiment differs from the first embodiment in that the gas heating tube 40 is provided along the side plates 23 and 24 of the reaction tube body 20 such that the gas heating tube 40 is turned down or bent back before the center of the semiconductor wafer 90. Other structures are the same as those of the first embodiment.

The semiconductor wafer 90 is placed on a tweezer 130 and transferred into the reaction tube body 20, and is placed on the wafer supporting claws 122 of the wafer mounting plate 120 and disposed in a space 124. Further, the semiconductor wafer 90 on the wafer mounting plate 120 is placed on the tweezer 130 and carried out from the reaction tube 10. At those times, in order to determine a position of the tweezer 130 which transfers the semiconductor wafer 90 and an operating range of the tweezer 130, a teaching process is conducted. When the teaching process is conducted, the thermal insulator 72 and the heater 70 are detached. Clearances in all horizontal directions of the semiconductor wafer 90 and the wafer mounting plate 120 are checked by vertically seeing from above the reaction tube 10 through the ceiling plate 21. Clearances in vertical direction is also checked by horizontal observation through the side plate 23 and/or the side plate 24. Points of such checking of the clearances in vertical direction are: to check a height of the wafer mounting plate 120 so that the wafer mounting plate 120 and the semiconductor wafer 90 do not interfere with each other when the tweezer 130 on which the semiconductor wafer 90 is carried passes above the wafer mounting plate 120; and to check a vertical stroke motion of the tweezer 130 conducted when the semiconductor wafer 90 placed on the tweezer 130 is lowered to be placed on the wafer mounting plate 120, and the semiconductor wafer 90 placed on the wafer mounting plate 120 is picked up by the tweezer 130.

According to the third embodiment, when the reaction tube body 20 is viewed from the direction of the side plate 23 or 24, more than half portion of the semiconductor wafer 90 can be observed, and the wafer mounting plate 120 can also be observed from its one end 121 to a region beyond the central portion of the space 124 in which the semiconductor wafer 90 is to be provided. Therefore, when the teaching process is conducted, because the semiconductor wafer 90 and the wafer mounting plate 120 can sufficiently be observed, the teaching process can easily be conducted.

For conducting the teaching process, when the reaction tube body 20 is viewed from the direction of the side plate 23 or 24, it is preferable that at least a region from the one end 121 of the wafer mounting plate 120 to one end 91 of the semiconductor wafer 90 can be observed. Further, when the reaction tube 10 is viewed from the direction of the side plate 23 or 24, it is more preferable that at least a half of the semiconductor wafer 90, as well as a region of the wafer mounting plate 120 from its one end 121 to at least the central portion of the space 124 in which the semiconductor wafer 90 is to be provided. Therefore, it is preferable to provide the gas heating tube 40 along the side plates 23 and 24 of the reaction tube body 20 such that the gas heating tube 40 is bent back before the one end 91 of the semiconductor wafer 90, and it is more preferable to provide the gas heating tube 40 along the side plates 23 and 24 of the reaction tube body 20 such that the gas heating tube 40 is bent back before the center or the vicinity of the center of the semiconductor wafer 90.

In the third embodiment, a length of the gas heating tube 40 is shorter than that of the first embodiment. However, a length from the central portion 451 of the tube 45 through the tubes 46 and 48 to the corner portion 52 is set 240 mm or longer, and a length from the central portion 451 of the tube 45 through the tubes 47 and 49 to the corner portion 51 is set 240 mm or longer. Therefore, the reaction gas introduced from the gas discharging hole 60 provided in the vicinity of the corner portions 52 (32) and 51 (31) is sufficiently heated up to the same temperature as that in the reaction tube body 20. Therefore, according to the third embodiment also, the reaction gas is sufficiently preheated by the gas heating tube 40 and is introduced into the reaction tube body 20. As a result, an upstream portion of the semiconductor wafer 90 is restrained from being cooled by the reaction gas, which enhances the uniformity of distribution of temperature over the entire surface of the semiconductor wafer 90, and also enhances the uniformity of a thickness of a film over the entire surface which is formed on a surface of the semiconductor wafer 90, especially the uniformity of the thickness of the film in a direction of a flow of the reaction gas. Further, depending on a kind or type of the gas, it is possible to sufficiently decompose the reaction gas within the gas heating tube 40, and as a result, a quality of the film is enhanced.

Further, because the gas heating tube 40 is bent back, it is possible to shorten the length of that region of the gas heating tube 40 which extends along the side plates 23 and 24 of the reaction tube body 20 while keeping a sufficient length of a course of the reaction gas flowing through the gas heating tube 40. Therefore, it is possible to sufficiently preheat the reaction gas by the gas heating tube 40, and to increase that region of the reaction tube body 20 which can be observed through the side plates 23 and 24 of the reaction tube body 20 without being interrupted by the gas heating tube 40.

Also, because the gas heating tube 40 is disposed along the side plates 23 and 24, not along the ceiling plate 21 and the bottom plate 22, the semiconductor wafer 90 can be observed over its entire range through the ceiling plate 21 or the bottom plate 22, and the space 124 of the wafer mounting plate 120 and the wafer supporting claws 122 can also be observed over their entire ranges. Therefore, it is possible to easily and reliably conduct the teaching process in all directions on a horizontal plane for a process in which the semiconductor wafer 90 is placed on or taken out from the wafer mounting plate 120. In this way, the teaching process in all horizontal directions can be conducted by observing through the ceiling plate 23 or the bottom plate 22. Therefore, a teaching process through the side plate 23 or 24 can be conducted only for a vertical direction, and such teaching is possible only if a portion, rather than the entire, of the semiconductor wafer 90 can be observed. At that time, if about half or more of the semiconductor wafer 90, or about half or more of the space 124 of the wafer mounting plate 120 can be observed, the teaching process for a process in which the semiconductor wafer 90 is placed on or taken out from the wafer mounting plate 120 can be conducted easier and more reliably.

The gas heating tube 40 is disposed along the side plates 23, 24 and 25 of the reaction tube body 20. The gas heating tube 40 is welded to the reaction tube body 20. The tube 50 is provide with a plurality of gas discharging holes 60 forming a line parallel to a surface of the semiconductor wafer 90. These gas discharging holes 60 are arranged from the vicinity of the corner portion 31 (51) between the side plates 25 and 24 to the vicinity of the corner portion 32 (52) between the side plates 25 and 23. These gas discharging holes 60 are in communication with the opening 28 formed in the side plate 25. All of the reaction tube body 20, the gas heating tube 40, the reaction tube flange 26, the wafer mounting plate 120, the semiconductor wafer 90, the tube 44, the opening 28, the plurality of gas discharging holes 60 and the wafer transfer hole 27 are formed symmetrically.

In the first and third embodiments, the tube 50 of the gas heating tube 40 is provided with the plurality of gas discharging holes 60, and the side plate 25 of the reaction tube body 20 is provided with the opening 28 which is in communication with these plurality of gas discharging holes 60 and which exposes the gas discharging holes 60. In the second embodiment, the tube 50 of the gas heating tube 40 is provided with the plurality of gas introducing holes 128, and the tube 50 of the gas heating tube 40 is provided with the opening 160 which is in communication with these plurality of gas introducing holes 128. Alternatively, the tube 50 of the gas heating tube 40 may be provided with a plurality of gas discharging holes forming a line in parallel to a surface of the semiconductor wafer 90 at a height substantially equal to the semiconductor wafer 90, and the side plate 25 of the reaction tube body 20 may also be provided with a plurality of gas introducing holes which respectively correspond to these gas discharging holes. In such a case also, all of the reaction tube body 20, the gas heating tube 40, the reaction tube flange 26, the wafer mounting plate 120, the semiconductor wafer 90, the tube 44, the plurality of gas discharging holes, the plurality of gas introducing holes and the wafer transfer hole 27 are formed symmetrically.

In the first to third embodiments, the substrate processing apparatus is of a single substrate-processing type in which a sheet of the semiconductor wafer 90 is held in the reaction tube body 20. But it should be noted that the present invention can preferably be applied to a substrate processing apparatus in which a small number of substrates, preferably, two sheets of the semiconductor wafers 90 are held in the reaction tube body 20.

What is claimed is:

1. A substrate processing apparatus, comprising:

a heater;

a reaction tube body having a first gas introducing section and a gas exhausting section separated by a distance;

a substrate holder disposed in said reaction tube body and being capable of holding a substrate within said reaction tube body between said first gas introducing section and said gas exhausting section;

a gas heating tube provided along said reaction tube body and not between said heater and said reaction tube body, and having a second gas introducing section and a gas discharging section which is in communication with said first gas introducing section of said reaction tube body; and a thermal insulator covering said heater, said reaction tube body and said gas heating tube.

2. A substrate processing apparatus as recited in claim 1 wherein said gas heating tube has a structure such that a gas flowing in said gas heating tube flows from the side of said first gas introducing section toward the side of said gas exhausting section, and then returns to flow from said gas exhausting section side toward said first gas introducing section side.

3. A substrate processing apparatus as recited in claim 1, wherein said first gas introducing section and said gas exhausting section are separated in a first direction, said reaction tube body includes a first plate substantially perpendicular to said first direction, a second plate and a third plate substantially parallel to a first plane which includes said first direction and a second direction perpendicular to said first direction, and fourth and fifth plates which are substantially parallel to said first direction and are substantially perpendicular to said first plane, said first gas introducing section being provided in said first plate, said gas heating tube being disposed along one or more of said first plate, said fourth plate and said fifth plate, said substrate holder is capable of holding a substrate within said reaction tube body in a state where a face of said substrate to be processed is substantially parallel to said first plane, and said heater faces one or both of said second and third plates.

4. A substrate processing apparatus as recited in claim 3, wherein said gas heating tube is disposed along one or both of said fourth plate and said fifth plate and has a structure such that a gas flowing in said gas heating tube flows from said first gas introducing section side toward said gas exhausting section side, and then returns to flow from said gas exhausting section side toward said first gas introducing section side.

5. A substrate processing apparatus as recited in claim 3, wherein said gas heating tube is disposed along said first, fourth and fifth plates.

6. A substrate processing apparatus as recited in claim 5, wherein said gas heating tube has a structure such that the gas flowing in said gas heating tube flows from said first gas introducing section side toward said gas exhausting section side respectively along said fourth and fifth plates, then returns to flow from said gas exhausting section side toward said first gas introducing section side respectively along said fourth and fifth plates, and then flows along said first plate.

7. A substrate processing apparatus as recited in claim 6, wherein said gas heating tube has a structure such that the gas flowing in said gas heating tube first flows, along said first plate, from substantially a central portion of said first plate in said second direction toward said fourth and fifth plates, then flows from said first gas introducing section side toward said gas exhausting section side respectively along said fourth and fifth plates, then returns to flow from said gas exhausting section side toward said first gas introducing section respectively along said fourth and fifth plates, and then flows along said first plate.

8. A substrate processing apparatus as recited in claim 3, wherein said gas heating tube includes first and second tubes disposed in said first direction along said fourth plate, third and fourth tubes disposed in said first direction along said fifth plate, a fifth tube disposed in said second direction along said first plate, and a gas introducing tube, said second gas introducing section including said gas introducing tube, said gas introducing tube being in communication with one end of each of said first and third tubes, the other end of said first tube being in communication with one end of said second tube, the other end of said third tube being in communication with one end of said fourth tube, the other end of said second tube being in communication with one end of said fifth tube, the other end of said fourth tube being in communication with the other end of said fifth tube, and said fifth tube including said gas discharging section which is in communication with said first gas introducing section.

9. A substrate processing apparatus as recited in claim 8, wherein said gas heating tube further includes a sixth tube disposed in said second direction along said first plate, said gas introducing tube being in communication with said one end of each of said first and third tubes through said sixth tube.

10. A substrate processing apparatus as recited in claim 3, wherein said gas heating tube extends from said first gas introducing section side toward said gas exhausting section side, is bent back before an end of said substrate at said gas exhausting section side, and extends from said gas exhausting section side toward said first gas introducing section side.

11. A substrate processing apparatus as recited in claim 10, wherein said gas heating tube extends from said first gas introducing section side toward said gas exhausting section side, is bent back before the central portion of said substrate or before the vicinity of the central portion of said substrate, and extends from said gas exhausting section side toward said first gas introducing section side.

12. A substrate processing apparatus as recited in claim 10, wherein said gas heating tube is disposed along both of said fourth and fifth plates.

13. A substrate processing apparatus as recited in claim 3, wherein said gas discharging section of said gas heating tube is provided along said first plate, and said gas discharging section includes a plurality of gas discharging holes provided substantially parallel to said second direction.

14. A substrate processing apparatus as recited in claim 13, wherein said reaction tube body is substantially symmetrical in said second direction with respect to a line in said first direction, said substrate holder is substantially symmetrical in said second direction with respect to said line, and being capable of holding said substrate substantially symmetrically in said second direction with respect to said line, said gas heating tube is substantially symmetrical in said second direction with respect to said line, and said plurality of gas discharging holes are disposed substantially symmetrically in said second direction with respect to said line.

15. A substrate processing apparatus as recited in claim 13, wherein said plurality of gas discharging holes are arranged from the vicinity of a first corner portion formed between said first and fourth plates to the vicinity of a second corner portion formed between said first and fifth plates.

16. A substrate processing apparatus as recited in claim 13, wherein said first gas introducing section of said reaction tube body includes an opening provided in said first plate, said opening exposing said plurality of gas discharging holes.

17. A substrate processing apparatus as recited in claim 3, wherein said first gas introducing section includes a plurality of gas introducing holes provided in said first plate, substantially parallel to said second direction.

18. A substrate processing apparatus as recited in claim 17, wherein said reaction tube body is substantially symmetrical in said second direction with respect to a line in said first direction, said substrate holder is substantially symmetrical in said second direction with respect to said line, and is capable of holding said substrate substantially symmetrically in said second direction with respect to said line, said gas heating tube is substantially symmetrical in said second direction with respect to said line, and said plurality of gas introducing holes is substantially symmetrical in said second direction with respect to said line.

19. A substrate processing apparatus as recited in claim 17, wherein said plurality of gas introducing holes are arranged from the vicinity of a first corner portion formed between said first and fourth plates to the vicinity of a second corner portion formed between said first and fifth plates.

20. A substrate processing apparatus as recited in claim 1, wherein said first gas introducing section and said gas exhausting section are separated in a first direction, said reaction tube body is substantially formed in a rectangular parallelepiped shape, said reaction tube body includes a first plate substantially perpendicular to said first direction, a second plate and a third plate substantially parallel to a first plane which includes said first direction and a second direction perpendicular to said first direction, and fourth and fifth plates which are substantially parallel to said first direction and are substantially perpendicular to said first plane, and a sixth plate disposed, substantially perpendicularly to said first direction, at the opposite side of said first plate, said first gas introducing section is provided in said first plate, and said sixth plate is provided with said gas exhausting section.

21. A substrate processing apparatus as recited in claim 1, wherein said gas heating tube is secured to said reaction tube body.

22. A substrate processing apparatus as recited in claim 1, wherein said substrate processing apparatus is of a hot-wall type.

23. A substrate processing apparatus as recited in claim 1, wherein said reaction tube body has a structure such that a substrate, or a small number of substrates are held.

24. A substrate processing apparatus as recited in claim 1, wherein said substrate is a semiconductor wafer.

25. A hot-wall type substrate processing apparatus, comprising:

a reaction tube body including a first gas introducing section and a gas exhausting section separated by a distance from each other in a first direction, a first plate substantially perpendicular to said first direction and having said first gas introducing section, a second plate and a third plate substantially parallel to a first plane including said first direction and a second direction substantially perpendicular to said first direction; and fourth and fifth plates which are substantially parallel to said first direction and are substantially perpendicular to said first plane;

a heater facing one or both of said second and third plates;

a substrate holder disposed in said reaction tube body and being capable of holding a substrate within said reaction tube body between said first gas introducing section and said gas exhausting section in a state where a face of said substrate to be processed is substantially parallel to said first plane; and a gas heating tube provided along one or both of said fourth plate and said fifth plate, and having a second gas introducing section and a gas discharging section which is in communication with said first gas introducing section.

26. A substrate processing apparatus as recited in claim 25, wherein said gas heating tube is also disposed along said first plate.

27. A substrate processing apparatus as recited in claim 25, wherein said heater is provided such as to face said second plate and said third plate.

* * * * *